United States Patent
Chen et al.

(10) Patent No.: US 8,778,573 B2
(45) Date of Patent: Jul. 15, 2014

(54) MANUFACTURING METHOD OF TRANSPARENT ELECTRODE AND MASK THEREOF

(71) Applicant: Shenzhen China Star Optoelectronics Technology Co., Ltd., Guangdong (CN)

(72) Inventors: Cheng-hung Chen, Shenzhen (CN); Zui Wang, Shenzhen (CN)

(73) Assignee: Shenzhen China Star Optoelectronics Technology co., Ltd., Shenzhen, Guangdong (CN)

( * ) Notice: Subject to any disclaimer, the term of this patent is extended or adjusted under 35 U.S.C. 154(b) by 109 days.

(21) Appl. No.: 13/642,550

(22) PCT Filed: Oct. 9, 2012

(86) PCT No.: PCT/CN2012/082625
§ 371 (c)(1),
(2), (4) Date: Oct. 21, 2012

(87) PCT Pub. No.: WO2014/047961
PCT Pub. Date: Apr. 3, 2014

(65) Prior Publication Data
US 2014/0087290 A1    Mar. 27, 2014

(30) Foreign Application Priority Data
Sep. 26, 2012  (CN) .......................... 2012 1 0363684

(51) Int. Cl.
*G02B 5/20*   (2006.01)

(52) U.S. Cl.
USPC ............... 430/5; 430/313; 430/318; 430/319; 430/321

(58) Field of Classification Search
None
See application file for complete search history.

(56) References Cited

U.S. PATENT DOCUMENTS

| | | | |
|---|---|---|---|
| 2007/0001979 A1* | 1/2007 | Yoo et al. | 345/98 |
| 2011/0223393 A1* | 9/2011 | Hsiao et al. | 428/195.1 |
| 2012/0092607 A1* | 4/2012 | Hui | 349/143 |

* cited by examiner

Primary Examiner — John A. McPherson
(74) Attorney, Agent, or Firm — Andrew C. Cheng

(57) ABSTRACT

The present invention provides a manufacturing method of transparent electrode and mask thereof. The method includes: forming a film on a glass substrate, and coating photo-resist on film; irradiating photo-resist through mask, wherein the mask at corresponding active area of liquid crystal panel forming, from outer area to inner area, at least a first area and a second area, gap of pattern corresponding to transparent electrode in first area being first gap, gap of pattern in second area being second gap, first gap being greater than corresponding default gap, difference between first gap and corresponding default gap being greater than difference between second gap and corresponding default gap: and performing photolithography and etching processes on substrate after exposure to form transparent electrodes on substrate. As such, the present invention can reduce gap errors of formed transparent electrodes in entire active area to improve display effect.

8 Claims, 3 Drawing Sheets

MANUFACTURING METHOD OF TRANSPARENT ELECTRODE AND MASK THEREOF

BACKGROUND OF THE INVENTION

1. Field of the Invention

The present invention relates to the field of liquid crystal displaying techniques, and in particular to a manufacturing method of transparent electrode and mask thereof.

2. The Related Arts

The current technique for manufacturing transparent electrode of substrate of liquid crystal display device is to from film on a glass substrate and then to coat a layer of photo-resist on the thin film. Then, irradiation is performed on the photo-resist through mask. Because the shielding of mask, the pattern corresponding to the pattern will not be exposed. In the later development process, the exposed photo-resist will be washed away by the photolithography solution, During the etching process, the thin film protected by the photo-resist will remain to form transparent electrode.

However, referring to FIG. 1, in the substrate, the transparent electrodes are mainly distributed in active area (AA) 110. Therefore, the thin film required to remain in active area 110 is more than thin film required to remain in non-active area 120. Hence, during photolithography process. non-active area 120 consumes more photolithography solution than active area 110 so that the photolithography solution in non-active area 120 has a lower density than the photolithography solution in active area 110. In addition, after diffusion (shown as arrows in FIG. 1 indicating diffusing to lower density), the photolithography solution in border area of active area 110 bordering non-active area 120 has a lower density than the photolithography solution in central area of active area 110 away from non-active area 120, which leads to the gap of photo-resist pattern in border area smaller than gap of photo-resist in central area. A similar situation occurs in etching process, which leads to gaps of transparent electrodes in border area of active area 110 differ from gaps of transparent electrodes in central area of active area 110, and affects the display effect.

SUMMARY OF THE INVENTION

The technical issue to be addressed by the present invention is to provide a manufacturing method of transparent electrode and mask thereof, able to reduce gap errors of formed transparent electrodes in the entire active area so as to improve display effect.

The present invention provides a manufacturing method of transparent electrode, which comprises the steps of: using vacuum deposition, sputtering, molecular beam vapor deposition, or chemical vapor deposition to form a thin film on a glass substrate, and coating a layer of photo-resist on the thin film; irradiating the photo-resist through mask, wherein the mask at corresponding active area of liquid crystal panel forming, from outer area towards inner area, a first area, a second area and a third area, gap of pattern corresponding to transparent electrode in the first area being a first gap, gap of pattern corresponding to transparent electrode in the second area being a second gap, first gap being greater than a corresponding default gap, difference between the first gap and the corresponding default gap being greater than difference between the second gap and the corresponding default gap, the third area being disposed between the first area and the second area and gap of pattern corresponding to transparent electrode in the third area being the first gap or the second gap, ratio of the first gap decreasing gradually from outer area to inner area and ratio of the second gap increasing gradually from outer area to inner area; and performing photolithography process and etching process on glass substrate after exposure to form transparent electrodes on the glass substrate.

The present invention provides a manufacturing method of transparent electrode, which comprises the steps of: forming a thin film on a glass substrate, and coating a layer of photo-resist on the thin film; irradiating the photo-resist through mask, wherein the mask at corresponding active area of liquid crystal panel forming, from outer area towards inner area, at least a first area and a second area, gap of pattern corresponding to transparent electrode in the first area being a first gap, gap of pattern corresponding to transparent electrode in the second area being a second gap, first gap being greater than a corresponding default gap, difference between the first gap and the corresponding default gap being greater than difference between the second gap and the corresponding default gap; and performing photolithography process and etching process on glass substrate after exposure to form transparent electrodes on the glass substrate.

According to a preferred embodiment of the present invention, the mask at corresponding active area of liquid crystal panel forms, from outer area towards inner area, a first area, a second area and a third area, the third area is disposed between the first area and the second area and gap of pattern corresponding to transparent electrode in the third area is the first gap or the second gap; ratio of the first gap decreases gradually from outer area to inner area and ratio of the second gap increases gradually from outer area to inner area.

According to a preferred embodiment of the present invention, the first area, the second area and the third area are rectangular with same ratio of width and length.

According to a preferred embodiment of the present invention, the mask at corresponding active area of liquid crystal panel forms, from outer area towards inner area, a first area, a second area and a third area, the third area is disposed between the first area and the second area and gap of pattern corresponding to transparent electrode in the third area decreases gradually from outer area to inner area.

The present invention provides a mask, the mask at corresponding active area of liquid crystal panel forming, from outer area towards inner area, at least a first area and a second area, gap of pattern corresponding to transparent electrode in the first area being a first gap, gap of pattern corresponding to transparent electrode in the second area being a second gap, first gap being greater than a corresponding default gap, and difference between the first gap and the corresponding default gap being greater than difference between the second gap and the corresponding default gap.

According to a preferred embodiment of the present invention, the mask at corresponding active area of liquid crystal panel forms, from outer area towards inner area, a first area, a second area and a third area, the third area is disposed between the first area and the second area and gap of pattern corresponding to transparent electrode in the third area is the first gap or the second gap; ratio of the first gap decreases gradually from outer area to inner area and ratio of the second gap increases gradually from outer area to inner area.

According to a preferred embodiment of the present invention, the mask at corresponding active area of liquid crystal panel forms, from outer area towards inner area, a first area, a second area and a third area, the third area is disposed between the first area and the second area and gap of pattern corresponding to transparent electrode in the third area decreases gradually from outer area to inner area.

The efficacy of the present invention is that to be distinguished from the state of the art. The present invention uses the mask to dispose a first area near the non-active area and a second area far away from the non-active area. The gap of pattern in the first area is larger than the gap of pattern in the second area, The density of photolithography solution and the density of etching solution in the first area are lower; then, the default gap of the area is disposed to be larger. The density of photolithography solution and the density of etching solution in the first area are higher; then, the default gap of the area is disposed to be smaller. As such, the gap difference resulted from density difference is compensated so as to reduce gap errors of formed transparent electrodes in the entire active area so as to improve display effect.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings.

DETAILED DESCRIPTION OF THE PREFERRED EMBODIMENTS

The following description refers to drawings and embodiments of the present invention.

Figure 1:
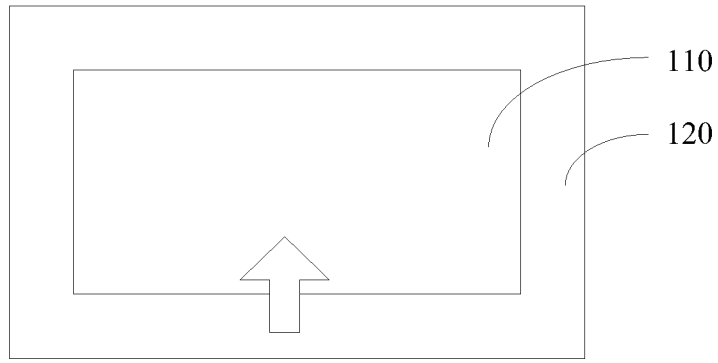
FIG. 1 is a schematic view showing density diffusion of a known manufacturing method of transparent electrode.
Figure 2:
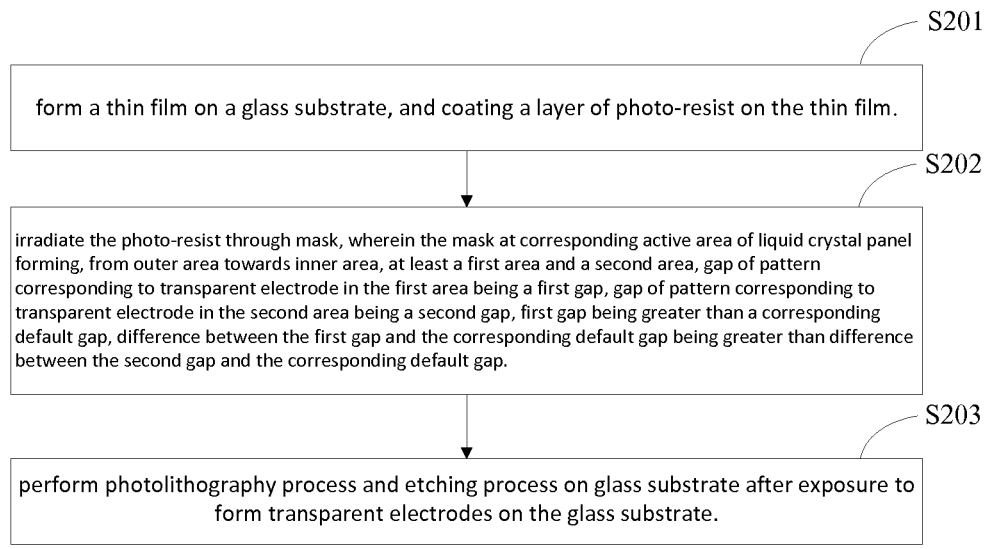
FIG. 2 is a flowchart of an embodiment of the manufacturing method of transparent electrode according to the present invention.

Referring to FIG. 2, FIG. 2 is a flowchart of an embodiment of the manufacturing method of transparent electrode according to the present invention. The manufacturing method of transparent electrode comprises the steps of:

Step 201: forming a thin film on a glass substrate, and coating a layer of photo-resist on the thin film.

A thin film is by vacuum deposition, sputtering, molecular beam vapor deposition, or chemical vapor deposition on a glass substrate, and a layer of photo-resist is coated by photo-resist coating machine on the thin film.

Step 202: irradiating the photo-resist through mask.

The photo-resist coated glass substrate is transported to photolithography device, the photolithography light source irradiates on the photo-resist through the mask. Also refer to FIG. 3. The mask at corresponding active area 300 of liquid crystal panel forms, from outer area towards inner area, at least a first area 310 and a second area 320. Gap of pattern corresponding to transparent electrode in the first area 310 is defined as a first gap 312, and gap of pattern corresponding to transparent electrode in the second area 320 is defined as a second gap 322. First gap 312 is greater than a corresponding default gap, difference between the first gap 312 and the corresponding default gap being greater than difference between the second gap 322 and the corresponding default gap.

The default gap is the expected gap between the thin films after photolithography etching. In idealistic situation, the gap between the thin films after photolithography etching should be the same as the expected gap.

Step 203: performing photolithography process and etching process on glass substrate after exposure to form transparent electrodes on the glass substrate.

After exposure, the glass substrate is placed in photolithography solution for photolithography to remove unexposed photo-resist. Then, the post-photolithography glass substrate is retrieved, washed and transported to etching device. Etching solution is added to etch away the part not coated with photo-resist. Finally, the photo-resist is removed to form the substrate.

The efficacy of the present invention is that to be distinguished from the state of the art. The present invention uses the mask to dispose a first area near the non-active area and a second area far away from the non-active area. The gap of pattern in the first area is larger than the gap of pattern in the second area. The density of photolithography solution and the density of etching solution in the first area are lower; then, the default gap of the area is disposed to be larger. The density of photolithography solution and the density of etching solution in the first area are higher; then, the default gap of the area is disposed to be smaller. As such, the gap difference resulted from density difference is compensated so as to reduce gap errors of formed transparent electrodes in the entire active area so as to improve display effect.

Figure 4:
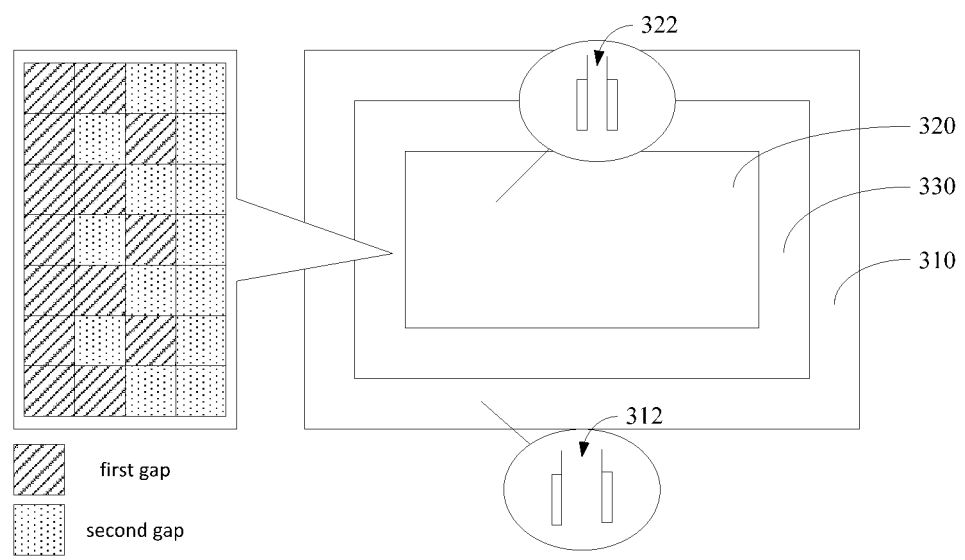
FIG. 4 is a schematic view showing the structure of mask in another embodiment of the manufacturing method of transparent electrode according to the present invention.

Referring to FIG. 4, FIG. 4 is a schematic view showing the structure of mask in another embodiment of the manufacturing method of transparent electrode according to the present invention. The instant embodiment of manufacturing method of transparent electrode is similar to the previous embodiment, except that the mask at corresponding active area of liquid crystal panel forms, from outer area towards inner area, a first area 310, a second area 320 and a third area 330. The third area 330 is disposed between the first area 310 and the second area 320 and gap of pattern corresponding to transparent electrode in the third area 330 is the first gap 312 or the second gap 322. Also, ratio of the first gap 312 decreases gradually from outer area to inner area and ratio of the second gap 322 increases gradually from outer area to inner area.

Specifically, first area 310, second area 320 and third area 330 use the pixel size as unit to divide into rectangular areas with the same ratio of width and length. The gap of pattern in the unit of the first area 310 is defined as the first gap 312. The gap of pattern in the unit of the second area 320 is defined as the second gap 322. In the third area 330, the area close to first area 310 is disposed with unit of first gap 312 is close to 100%, and the area close to second area 320 is disposed with unit of second gap 322 is close to 100%. Between the two areas, from the outer area to the inner area, the number of units of first gap 312 decreases gradually and the number of units of second gap 322 increases gradually.

By setting gap of pattern corresponding to transparent electrode in the third area 330 as the first gap 312 or the second gap 322, and from the outer area to the inner area, gradually decreasing the number of units of first gap 312 and gradually increasing the number of units of second gap 322 increases gradually, the gap error between transparent electrodes in the entire active area after formation is reduced and extra manufacturing specification is avoided to reduce the difficulty of mask processing and improve mask processing precision.

Figure 5:
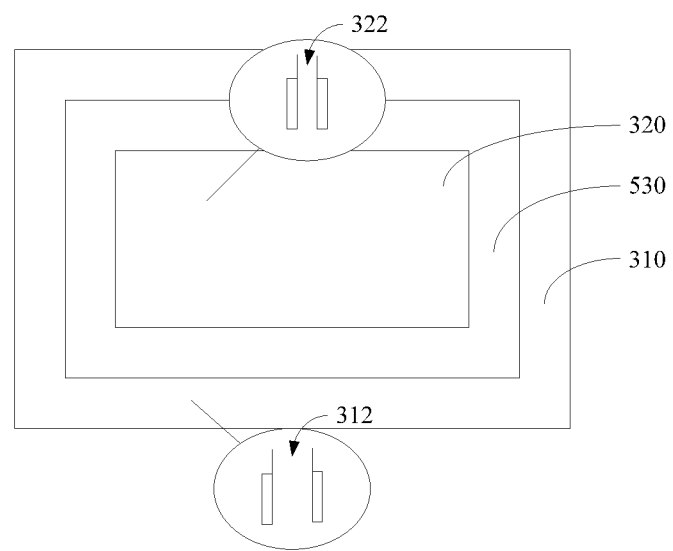
FIG. 5 is a schematic view showing the structure of mask in yet another embodiment of the manufacturing method of transparent electrode according to the present invention.

Referring to FIG. 5, FIG. 5 is a schematic view showing the structure of mask in yet another embodiment of the manufacturing method of transparent electrode according to the present invention. The instant embodiment of manufacturing method of transparent electrode is similar to the previous embodiment, except that the gap of pattern corresponding to transparent electrode in the third area 530 decreases gradually from outer area to inner area. Specifically, the gap of pattern can be gap 1, gap 2, gap 3, gap 4, . . . , and o on, where gap 1>gap 2>gap 3>gap 4> . . . and so on.

Figure 3:
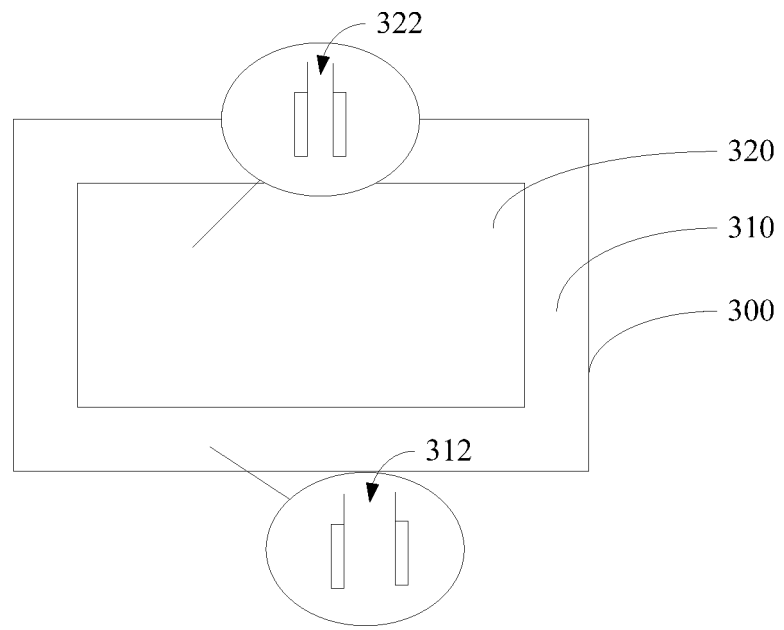
FIG. 3 is a schematic view showing the structure of mask in an embodiment of the manufacturing method of transparent electrode according to the present invention.

The present invention further provides a manufacturing equipment for transparent electrode, which comprises a photolithography light source and mask. The photolithography light source generates photolithography light to the mask, wherein the mask is as described in. FIG. 3 and FIG. 4, and the details will not repeated here.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the clams of the present invention.

What is claimed is:

1. A manufacturing method of transparent electrode, which comprises the steps of:
using vacuum deposition, sputtering, molecular beam vapor deposition, or chemical vapor deposition to form a thin film on a glass substrate, and coating a layer of photo-resist on the thin film;
irradiating the photo-resist through mask, wherein the mask at corresponding active area of liquid crystal panel forming, from outer area towards inner area, a first area, a second area and a third area, gap of pattern corresponding to transparent electrode in the first area being a first gap, gap of pattern corresponding to transparent electrode in the second area being a second gap, first gap being greater than a corresponding default gap, difference between the first gap and the corresponding default gap being greater than difference between the second gap and the corresponding default gap, the third area being disposed between the first area and the second area and gap of pattern corresponding to transparent electrode in the third area being the first gap or the second gap, ratio of the first gap decreasing gradually from outer area to inner area and ratio of the second gap increasing gradually from outer area to inner area; and
performing photolithography process and etching process on glass substrate after exposure to form transparent electrodes on the glass substrate.

2. A manufacturing method of transparent electrode, which comprises the steps of:
forming a thin film on a glass substrate, and coating a layer of photo-resist on the thin film;
irradiating the photo-resist through mask, wherein the mask at corresponding active area of liquid crystal panel forming, from outer area towards inner area, at least a first area and a second area, gap of pattern corresponding to transparent electrode in the first area being a first gap, gap of pattern corresponding to transparent electrode in the second area being a second gap, first gap being greater than a corresponding default gap, difference between the first gap and the corresponding default gap being greater than difference between the second gap and the corresponding default gap; and
performing photolithography process and etching process on glass substrate after exposure to form transparent electrodes on the glass substrate.

3. The manufacturing method as claimed in claim 2, characterized in that the mask at corresponding active area of liquid crystal panel forms, from outer area towards inner area, a first area, a second area and a third area, the third area is disposed between the first area and the second area and gap of pattern corresponding to transparent electrode in the third area is the first gap or the second gap; ratio of the first gap decreases gradually from outer area to inner area and ratio of the second gap increases gradually from outer area to inner area.

4. The manufacturing method as claimed in claim 3, characterized in that the first area, the second area and the third area are rectangular with same ratio of width and length.

5. The manufacturing method as claimed in claim 2, characterized in that the mask at corresponding active area of liquid crystal panel forms, from outer area towards inner area, a first area, a second area and a third area, the third area is disposed between the first area and the second area and gap of pattern corresponding to transparent electrode in the third area decreases gradually from outer area to inner area.

6. A mask, wherein the mask at corresponding active area of liquid crystal panel forming, from outer area towards inner area. at least a first area and a second area, gap of pattern corresponding to transparent electrode in the first area being a first gap, gap of pattern corresponding to transparent electrode in the second area being a second gap, first gap being greater than a corresponding default gap, and difference between the first gap and the corresponding default gap being greater than difference between the second gap and the corresponding default gap.

7. The mask as claimed in claim 6, characterized in that the mask at corresponding active area of liquid crystal panel forms, from outer area towards inner area, a first area, a second area and a third area, the third area is disposed between the first area and the second area and gap of pattern corresponding to transparent electrode in the third area is the first gap or the second gap; ratio of the first gap decreases gradually from outer area to inner area and ratio of the second gap increases gradually from outer area to inner area.

8. The mask as claimed in claim 6, characterized in that the mask at corresponding active area of liquid crystal panel forms, from outer area towards inner area, a first area, a second area and a third area, the third area Is disposed between the first area and the second area and gap of pattern corresponding to transparent electrode in the third area decreases gradually from outer area to inner area.

* * * * *